US010680408B2

(12) United States Patent
Kurczveil et al.

(10) Patent No.: US 10,680,408 B2
(45) Date of Patent: Jun. 9, 2020

(54) QUANTUM DOT COMB LASERS WITH EXTERNAL CAVITY

(71) Applicant: HEWLETT PACKARD ENTERPRISE DEVELOPMENT LP, Houston, TX (US)

(72) Inventors: Geza Kurczveil, Santa Barbara, CA (US); Chong Zhang, Santa Barbara, CA (US); Di Liang, Santa Barbara, CA (US); Raymond G. Beausoleil, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/108,399

(22) Filed: Aug. 22, 2018

(65) Prior Publication Data
US 2020/0067274 A1 Feb. 27, 2020

(51) Int. Cl.
*H01S 5/10* (2006.01)
*H01S 5/50* (2006.01)
*H01S 5/34* (2006.01)
*H01S 5/343* (2006.01)
*H01S 5/065* (2006.01)
*H01S 5/14* (2006.01)
*H01S 5/022* (2006.01)

(52) U.S. Cl.
CPC .......... *H01S 5/1096* (2013.01); *H01S 5/0228* (2013.01); *H01S 5/0651* (2013.01); *H01S 5/1003* (2013.01); *H01S 5/1071* (2013.01); *H01S 5/146* (2013.01); *H01S 5/3412* (2013.01); *H01S 5/34313* (2013.01); *H01S 5/50* (2013.01)

(58) Field of Classification Search
CPC ........ H01S 5/1096; H01S 5/50; H01S 5/1003; H01S 5/1071; H01S 5/3412; H01S 5/146; H01S 5/0651; H01S 5/34313; H01S 5/0228
See application file for complete search history.

(56) References Cited

U.S. PATENT DOCUMENTS

| | | | |
|---|---|---|---|
| 7,294,280 B2 | 11/2007 | Sherrer et al. | |
| 7,701,983 B2 * | 4/2010 | Suzuki | G02B 6/12007 372/20 |
| 9,748,738 B2 | 8/2017 | Krishnamoorthy et al. | |
| 9,774,165 B2 | 9/2017 | Garnache-Creuillot et al. | |
| 2003/0108081 A1 * | 6/2003 | Ryu | H01S 5/06256 372/102 |
| 2003/0133477 A1 * | 7/2003 | Lin | H01S 3/06791 372/6 |
| 2004/0120364 A1 * | 6/2004 | Koulikov | H01S 5/141 372/20 |

(Continued)

OTHER PUBLICATIONS

G. Ortner et al., "External cavity InAs/InP quantum dot laser with a tuning range of 166 nm", Appl. Phys. Lett. 88, 121119, 2006 (Year: 2006).*

(Continued)

*Primary Examiner* — Xinning(Tom) Niu
(74) *Attorney, Agent, or Firm* — Sheppard Mullin Richter & Hampton LLP

(57) ABSTRACT

A quantum dot comb laser includes a body defining a lasing cavity and an extension defining an external cavity, the FSR of the lasing cavity being an inverse of an integer multiple of the FSR of the external cavity.

20 Claims, 10 Drawing Sheets

(56) References Cited

U.S. PATENT DOCUMENTS

2004/0202223 A1* 10/2004 Crosson ................. H01S 5/141
  372/97

OTHER PUBLICATIONS

D. Romanini et al.; "Introduction to Cavity Enhanced Absorption Spectroscopy"; 2014; 61 pages.
Pochet, M. et al.; "Modulation Response of a Long-Cavity, Gainlevered Quantum-dot Semiconductor Laser"; Jan. 17, 2014; 9 pages.
Yamamoto, N. et al.; "Quantum Dot Photonic Devices and Their Material Fabrications"; Jan. 1, 2010; 20 pages.
Donati et al., "The Diagram of Feedback Regimes Revisited", IEEE Journal of Selected Topics in Quantum Electronics, vol. 19, No. 4, 2013, 10 pages.
Li et al., "Harmonic mode-locking using the double interval technique in quantum dot lasers", Optics Express, vol. 18, No. 14, 2010, pp. 14637-14643.
Srinivasan et al., "Harmonically Mode-Locked Hybrid Silicon Laser With Intra-Cavity Filter to Suppress Supermode Noise", IEEE Journal of Selected Topics in Quantum Electronics, vol. 20, 2014, 8 pages.

* cited by examiner

US 10,680,408 B2

QUANTUM DOT COMB LASERS WITH EXTERNAL CAVITY

This invention was made with Government support under Agreement Number H98230-18-3-0001. The Government has certain rights in the invention.

BACKGROUND

As computers and computing systems get larger and more powerful, one of the factors restricting performance is the electrical nature of many of the signals in such systems. There has been a trend for some time to use optical signals to communicate between the various components of some larger computing systems. Among the optical sources used to generate these optical signals in the first instance are lasers. For example, next generation supercomputers require optical interconnects with aggregate bandwidths of several PB/s. The current approach is to use multiple single-wavelength lasers on one chip. These lasers can be either modulated directly or a separate modulator can be integrated on chip. Their outputs are then multiplexed using either ring, arrayed waveguide grating ("AWG"), or Echelle grating-based multiplexers.

BRIEF DESCRIPTION OF THE DRAWINGS

Examples described herein may be understood by reference to the following description taken in conjunction with the accompanying drawings, in which like reference numerals identify like elements.

Figure 1:
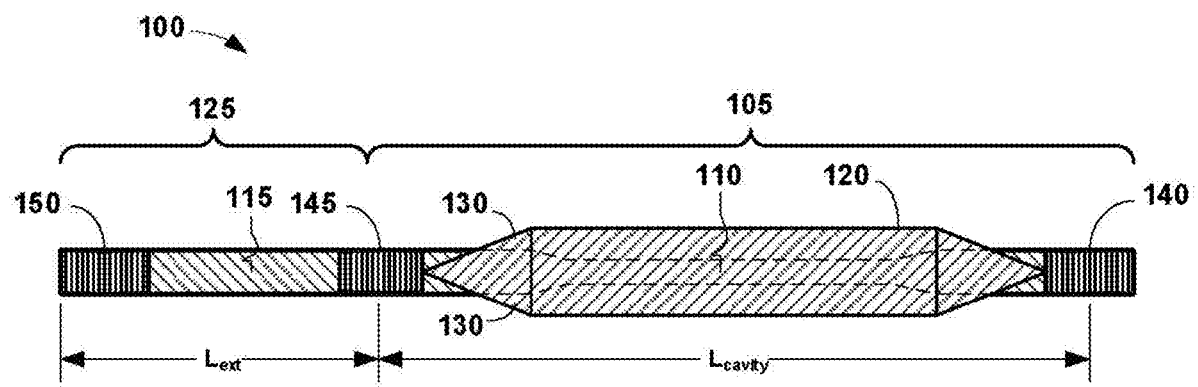
FIG. 1 is an example of a quantum dot comb laser in accordance with the technique disclosed herein.

While examples described herein are susceptible to various modifications and alternative forms, the drawings illustrate specific examples herein described in detail by way of example. It should be understood, however, that the description herein of specific examples is not intended to be limiting to the forms disclosed, but on the contrary, the intention is to cover all modifications, equivalents, and alternatives falling within the spirit and scope of the examples described herein and the appended claims.

DETAILED DESCRIPTION

Illustrative examples of the subject matter claimed below will now be disclosed. In the interest of clarity, not all features of an actual implementation are described in this specification. It may be appreciated that in the development of any such actual example, numerous implementation-specific decisions may be made to achieve the developers' specific goals, such as compliance with system-related and business-related constraints, which will vary from one implementation to another. Moreover, it may be appreciated that such a development effort, even if complex and time-consuming, would be a routine undertaking for those of ordinary skill in the art having the benefit of this disclosure.

A more promising approach to optical sources in a large computing environment uses a comb laser—a multi-wavelength laser. Such a device can be realized by using a cavity with a free spectral range ("FSR") that is much smaller than the gain bandwidth of the gain medium. One benefit of this approach is that the channel grid is determined by the cavity FSR. In a device with integrated mirrors, the cavity FSR is determined lithographically, and as a result, the individual wavelengths don't have to be tuned to fall on a grid. The wide gain bandwidth of ~60 nm (10 THz at 1310 nm), typical for an indium arsenide ("InAs") quantum dot in a gallium arsenide ("GaAs") well gain material, is particularly attractive for comb lasers. By growing dots of different sizes, the gain bandwidth can be widened to ~100 nm. In addition, the fast gain dynamics of quantum dots ensures a low relative intensity noise in each comb line, even in simple Fabry-Perot laser cavities.

Comb lasers are attractive dense wavelength division multiplex ("DWDM") light sources. They emit light at multiple wavelengths and the channel spacing, also known as the FSR, is inversely proportional to the length of the cavity, FSR $\propto 1/L_{cavity}$. For DWDM links, the optimal FSR is between 50 GHz and 80 GHz. If the FSR is much smaller, then the insertion loss of the external modulator will be too high. At the same time, FSRs larger than 80 GHz will not take full advantage of the available gain bandwidth. The FSR requirement translates to cavity lengths of 500 μm to 800 μm. However, mode converters, which transfer the mode from the silicon ("Si") to the quantum dot ("QD") gain region, may be on the order of 100 μm each. This significantly reduces the length of the semiconductor optical amplifier ("SOA") and thus reduce the amount of gain the SOA can provide.

It is therefore desirable to make a laser with a longer cavity length and use an external filter to determine the FSR of the comb laser. The presently disclosed quantum dot comb laser accomplishes this by defining an "external cavity" that effectively lengthens the laser cavity. The external cavity has an FSR that is an integer multiple of the laser cavity FSR. Since the FSR is inversely proportional to the length of the lasing cavity and the group index of the optical modes of the waveguides, one can approximate this with the length of the lasing cavity. More particularly, expressed mathematically:

$$L_{ext} = \frac{1}{N} \frac{n_{g\_cavity}}{n_{g\_ext}} L_{cavity}$$

wherein:
  $L_{ext}$=the length of the external cavity;
  N=the integer multiple;
  $n_{g\_cavity}$=the group index of the optical mode of the waveguide in the lasing cavity;
  $n_{g\_cavity}$=the group index of the optical mode of the waveguide in the external cavity; and
  $L_{cavity}$=the length of the lasing cavity.

Thus, since the FSR of the external cavity is an integer multiple of the FSR of the lasing cavity, the length of the external cavity is approximately the inverse of an integer multiple of the lasing cavity. The term "approximately" is a recognition that the group index of the optical modes of the waveguides keeps the measure of the length of the external waveguide from being precisely an integer of the inverse of a multiple of the lasing cavity.

Figure 2:
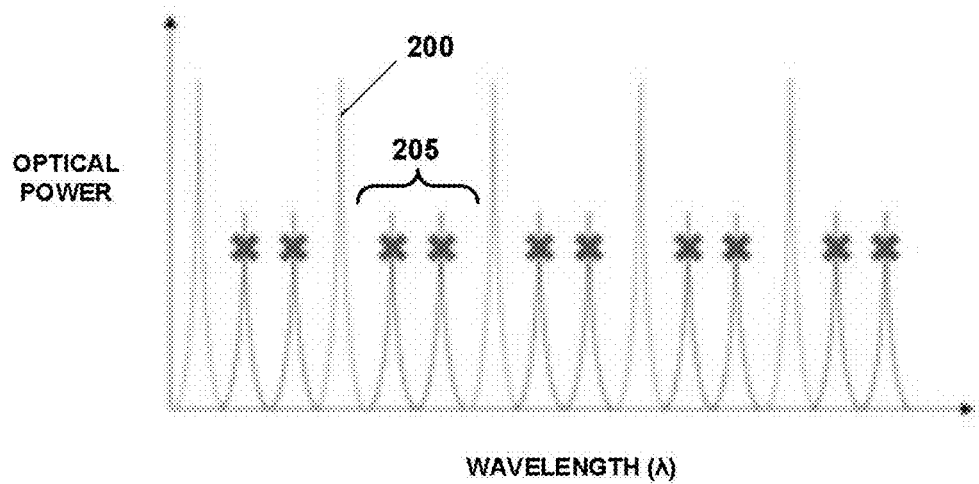
FIG. 2 illustrates the lasing output by the quantum dot comb laser in FIG. 1.

Turning now to the drawings, this is shown, schematically in FIG. 1 in a top view that is sectioned to show the structures that will now be disclosed. The quantum dot comb laser 100 includes a body 105 that defines a lasing cavity 110 having a length $L_{cavity}$ and an extension 125 defining an external cavity 115 having a length $L_{ext}$. In this particular example, $FSR_{ext}=3 \cdot FSR_{cavity}$, the external cavity 115 has a length ("$L_{ext}$") that is approximately one third the length ("$L_{cavity}$") of the lasing cavity 110—i.e., $L_{ext} \approx \frac{1}{3} * L_{cavity}$. As a result, only every third mode 200 lases as shown in FIG. 2, the other two modes 205 failing to lase. The external cavity 115 has an FSR that is an integer multiple of the laser FSR of the lasing cavity 110: $FSR_{ext}=N \cdot FSR_{cavity}$ (N=1, 2, 3, . . . ).

More particularly, the body 105 includes a semiconducting optical amplifier ("SOA") 120 that defines the lasing cavity 110 and an extension 125 that defines the external cavity 115. The SOA 120 includes a GaAs cladding 130 that is partially sectioned to show the lasing cavity 110, and the lasing cavity 110, which is the laser's active region, contains InAs quantum dots, InAs being a direct bandgap material. The lasing cavity 110 is bounded on a first end thereof by a fully reflective mirror 140 and on a second end thereof by an internal partially reflective mirror 145. The external cavity 115 is a semiconducting material such as silicon ("Si"), which is an indirect bandgap material. The external cavity 115 is bounded on a first end thereof by the internal partially reflective mirror 145 and on a second end thereof by an external partially reflective mirror 150.

In the illustrated example, the fully reflective mirror 140 is 100% reflective, the internal partially reflective mirror 145 is 50% reflective, and the external partially reflective mirror 150 is 0.01% reflective. Thus, the external partially reflective mirror 150 is minimally reflective relative to the internal partially reflective mirror 145 and the fully reflective mirror 140—i.e., on the order of 0.01% reflectivity. The reflectivities in any given example will be implementation specific in a manner that will be readily understood by those in the art having the benefit of this disclosure.

Furthermore, those skilled in the art having the benefit of this disclosure will appreciate that signal losses experienced during operation. For example, there will be, perhaps, a 1 dB loss from the taper preceding the internal partially reflective mirror 145 and a 3 dB from the interaction with the reflective mirror 145 itself. For a round trip through the SOA 120 between the fully reflective mirror 140 and the internal partially reflective mirror 145 there is a 7 dB loss, averaging a 3.5 dB for a single pass.

In the illustrated example, the output of the quantum dot comb laser is coupled out using a grating coupler. In the example of FIG. 1, the external partially reflective mirror 150 is in fact a grating coupler. However, other examples may use other structures. Such other structures may include, without limitation, a multimode interferometer with a loop mirror or a directional coupler with a loop mirror, for example.

In operation, energy is injected into the lasing cavity 110 and begins its transit through the lasing cavity 110. When it encounters the fully reflective mirror 140, substantially all the energy, that is 100% less signal loss, is reflected into the lasing cavity 110. When the energy encounters the internal partially reflective mirror 145, a portion is reflected into the lasing cavity 110 and a portion passes through the internal partially reflective mirror 145 into the external cavity 115. In this particular example, 50% less signal loss reflects into the lasing cavity 110 and 50% less signal loss passes into the external cavity 145. In the external cavity 115, when it encounters the external partially reflective mirror 150, a small portion is reflected into the external cavity 115 and the rest is output from the quantum dot comb laser 100. In, this example, 0.01% of the energy less signal loss reflects into the external cavity 115 and 99.99% less signal loss is output from the quantum dot comb laser 100. Energy in the external cavity 115 encountering the partially reflective mirror 145 passes through the internal partially reflective mirror 145 into the lasing cavity 110 less signal loss.

Figure 3A:
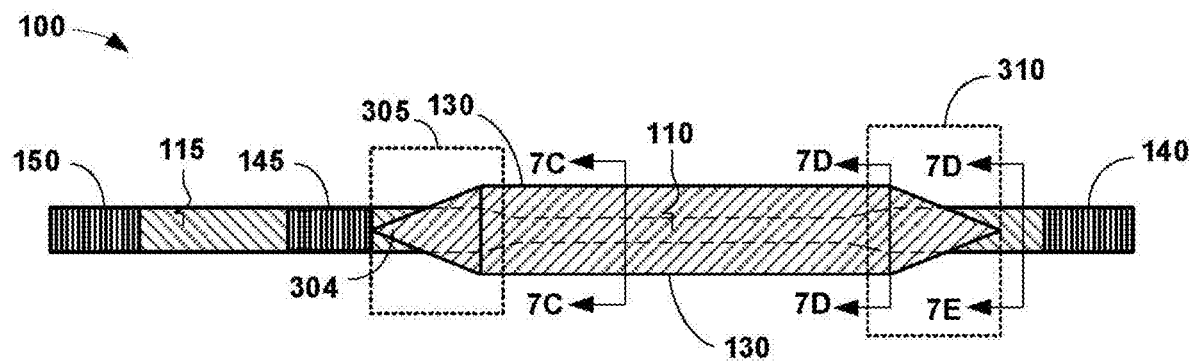
FIG. 3A-FIG. 3C illustrate mode conversions in a quantum dot comb laser in accordance with the technique disclosed herein.
Figure 3B:
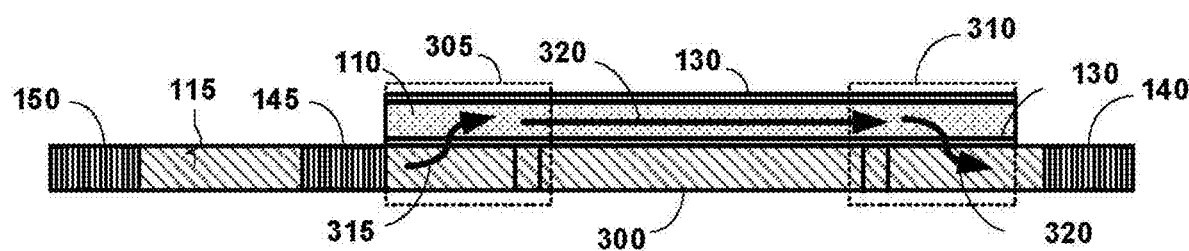
Figure 3C:
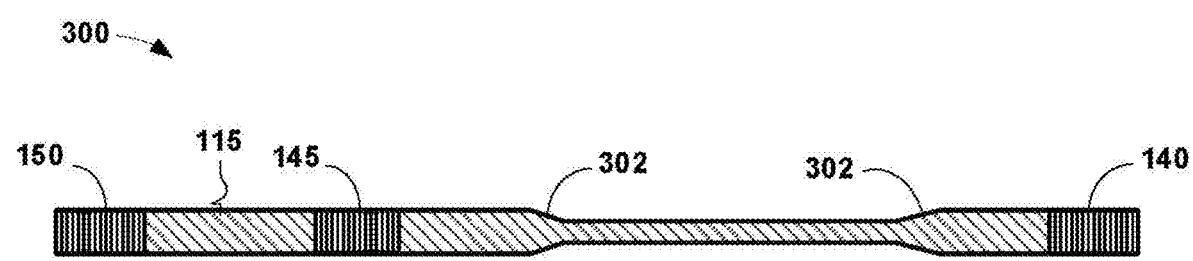

During the transit described immediately above, a mode converter transitions the mode from the Si waveguide (i.e., the silicon layer 300, shown in FIG. 3A-3C) to the hybrid Si/III-V waveguide (i.e., the lasing cavity 110, shown in FIG. 1, and underlying silicon layer 300, shown in FIG. 1). FIGS. 3A-3C illustrate the mode conversions in the quantum dot comb laser 100. FIG. 3A is a partially sectioned top view of the quantum dot comb laser 100 and FIG. 3B is a partially sectioned side view.

As will be discussed further below, the laser cavity 100 is fabricated from, in this particular example, GaAs. GaAs is what is known in the art as a "III-V" material. The lasing cavity 100 is disposed upon a silicon layer 300, shown in FIG. 3B, a part of which forms the external cavity 115. The silicon layer 300 is shown in FIG. 3C with the lasing cavity 110 removed to show the geometry of the silicon layer 300 without obscuration. The silicon layer 300 is show sectioned to illustrate the external partially reflective mirror 150, the internal partially reflective mirror 145, and the fully reflective mirror 140.

Mode conversions typically occur at changes in the width of the waveguide, whether in the Si layer 300 or in the III-V material of the lasing cavity 110. The mode conversion in FIG. 3A-FIG. 3C occur at the width changes 302 of the Si layer 300, best shown in FIG. 3C. Note that the tapers 304, only one indicated and only indicated in FIG. 3A, in the III-V material of the lasing cavity 110 contribute to the mode conversion.

Light traveling from the center of the SOA 120 to the left, will first see the Si width change 302. This will pull most of the light into the Si layer 300. But at the end of the mode converter 305 (where only the change 302 is in the Si width) ~15% of the light will still be in the III-V material of the lasing cavity 110. The triangular III-V taper 304 of the III-V material of the lasing cavity 110 after the Si taper 302 then pulls the remaining 15% of the light from the III-V material of the lasing cavity 110 to the Si layer 300. In the present illustrated example, both the tapers 304 and the Si layer 300 width changes 302 act as mode converters. Thus, in the illustrated example, the mode converter 305 includes the triangular III-V material taper 304 and the Si layer 300 width change 302 and may be referred to as a "Si to III-V mode converter".

The mode conversion is shown in FIG. 3B for a single transit in a single direction. The quantum dot comb laser 100 defines two mode converters 305, 310. Traveling from left to right, the optical energy will transition into the lasing cavity 100 as indicated by the arrow 315 in the mode converter 305. This is a Si to III-V mode conversion and the mode converter 305 is therefore a Si to III-V mode converter. The optical signal continues to transit across the lasing cavity 110 as indicated by the arrow 320. The optical signal then transitions back into the Si layer 300 as indicated by the arrow 325 in the mode converter 310. When the optical signal transits in the opposite direction, the mode conversions occur again and in the opposite direction. Because the optical signal is transitioning between Si and a III-V material, the mode converters 305, 310 may be referred to as "Si to III-V" mode converters.

Figure 4A:
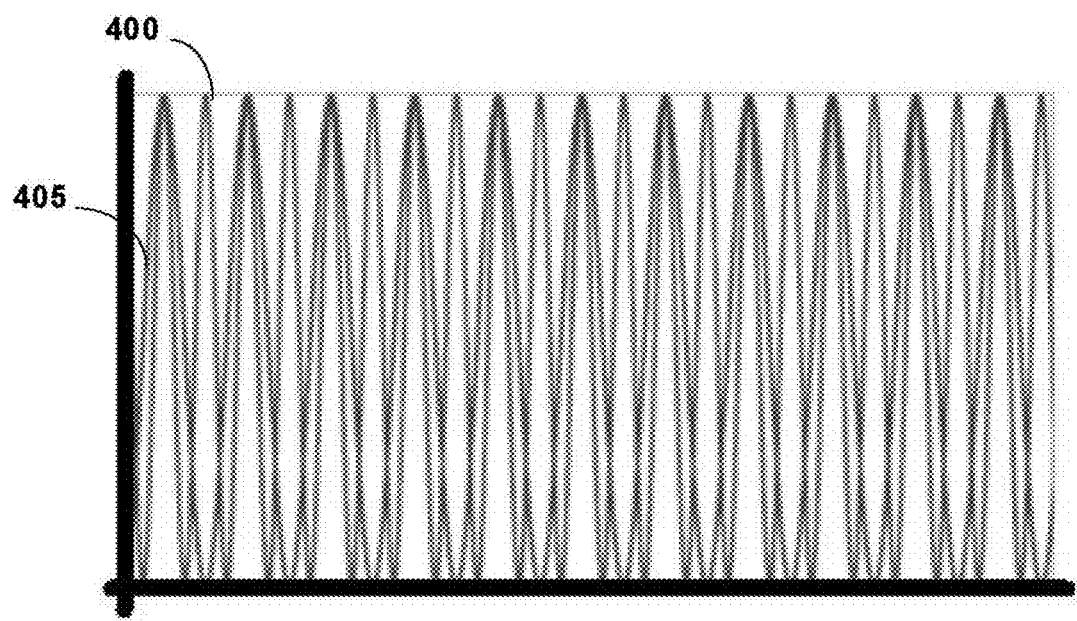
FIG. 4A-FIG. 4B illustrate how the transmissions of the lasing cavity and the external cavity constructively interfere when combined where the free spectral range ("FSR") of the external cavity is an integer multiple of the FSR for the lasing cavity.
Figure 4B:
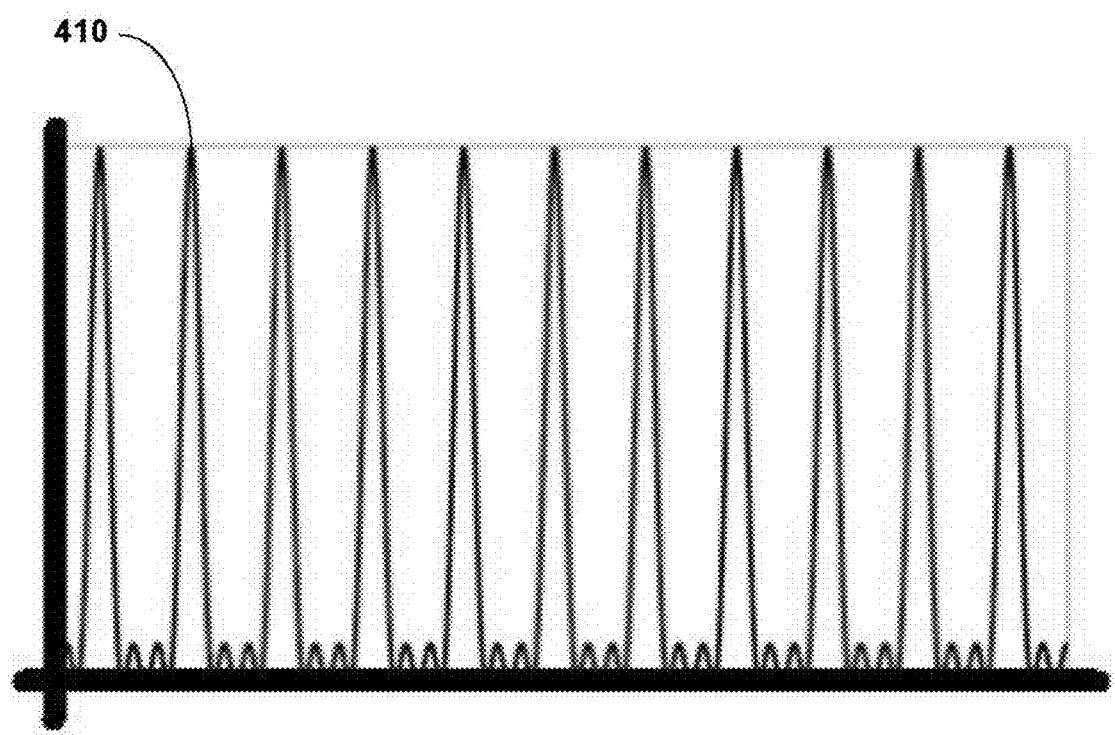
Figure 5A:
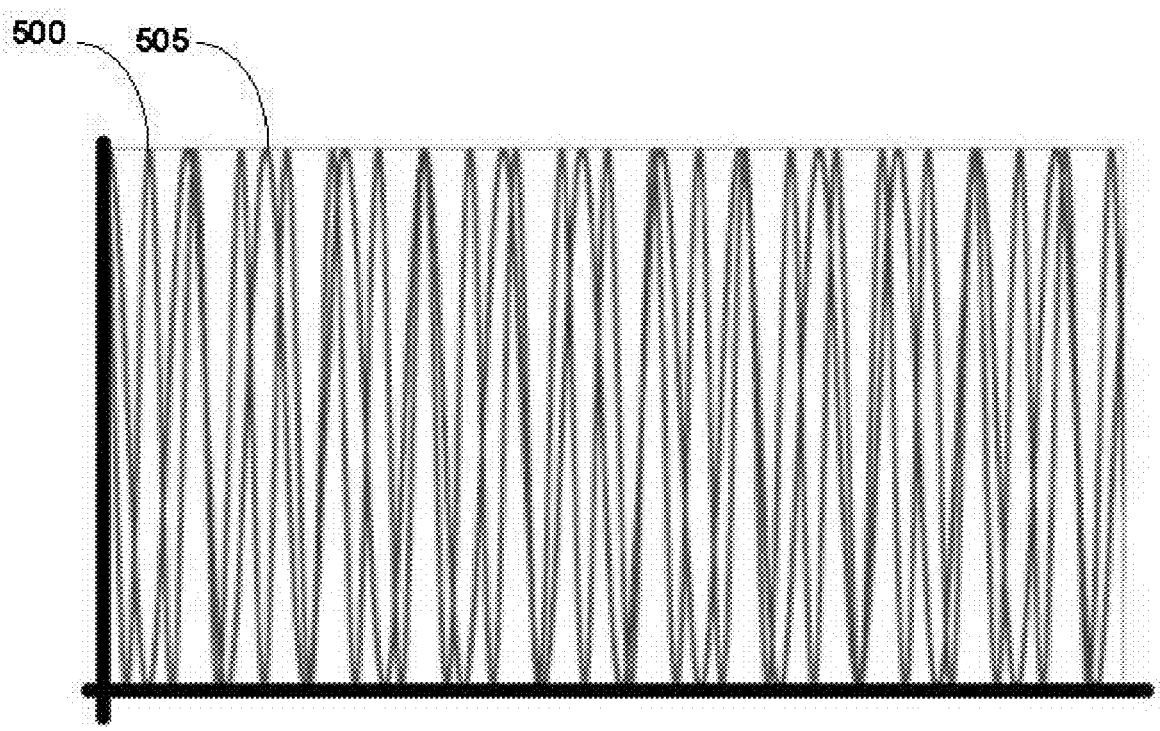
FIG. 5A-FIG. 5B illustrate how the transmissions of the lasing cavity and the external cavity destructively interfere when combined where the FSR of the external cavity is not an integer multiple of the FSR for the laser cavity.
Figure 5B:
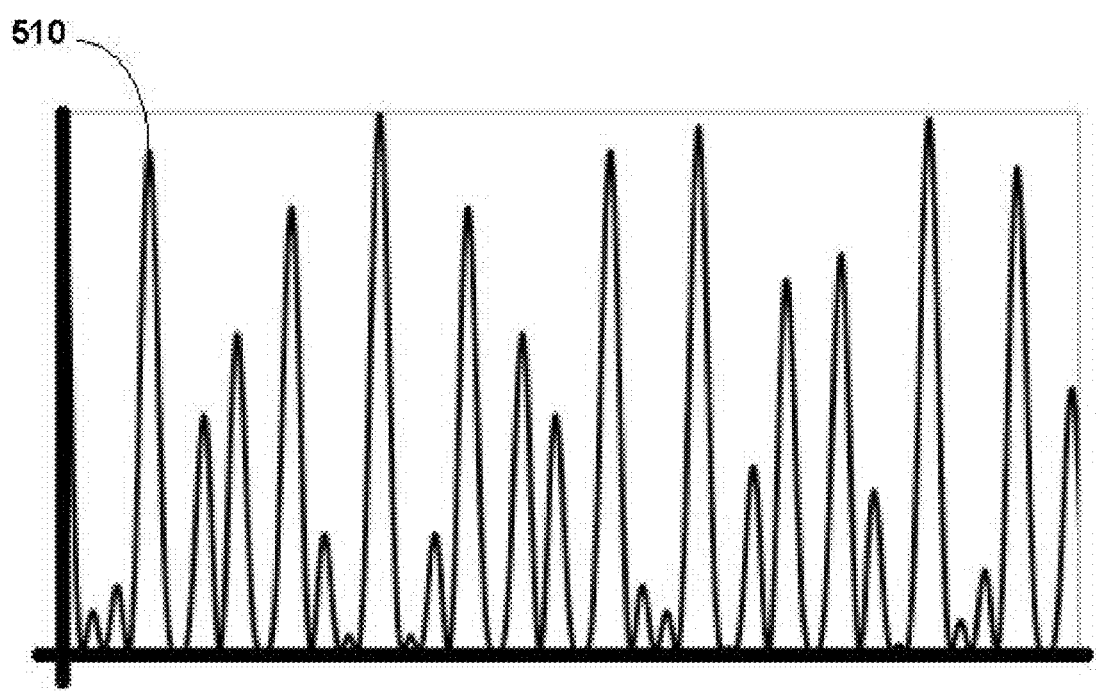

The effect of the length of the external cavity and the corresponding FSR is illustrated in FIG. 4A-FIG. 4B and FIG. 5A-FIG. 5B. FIG. 4A illustrates the transmission signal 400 from the lasing cavity 110 and the transmission signal 405 for the external cavity 115 separately for an $FSR_{ext}=2FSR_{cav}$. FIG. 4B shows the transmission signal 410 of the coupled cavity, i.e., the lasing cavity 110 and the external cavity 115 together. FIG. 5A-FIG. 5B show the same information but where $FSR_{ext}=1.724(\dots)FSR_{cav}$. FIG. 5A shows the transmission signal 500 for the lasing cavity 110 and the transmission signal 505 for the external cavity 115. FIG. 5B illustrates the transmission signal 510 for the coupled cavity. The difference between FIG. 4B and FIG. 5B is that the $FSR_{ext}$ is an integer multiple of $FSR_{cav}$ and so the two transmissions constructively interfere periodically instead of aperiodically as in FIG. 5B.

Figure 6A:
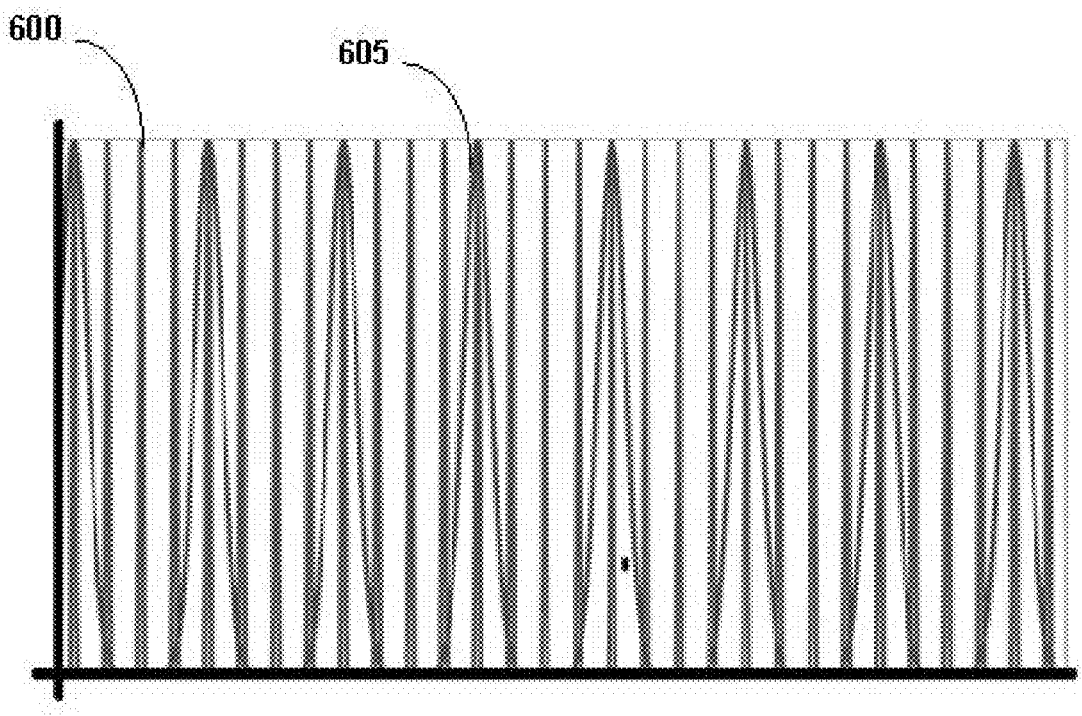
FIG. 6A-FIG. 6B illustrate one specific example of how the transmissions of the lasing cavity and the external cavity constructively interfere when combined where the FSR of the external cavity is an integer multiple of the FSR for the lasing cavity.
Figure 6B:
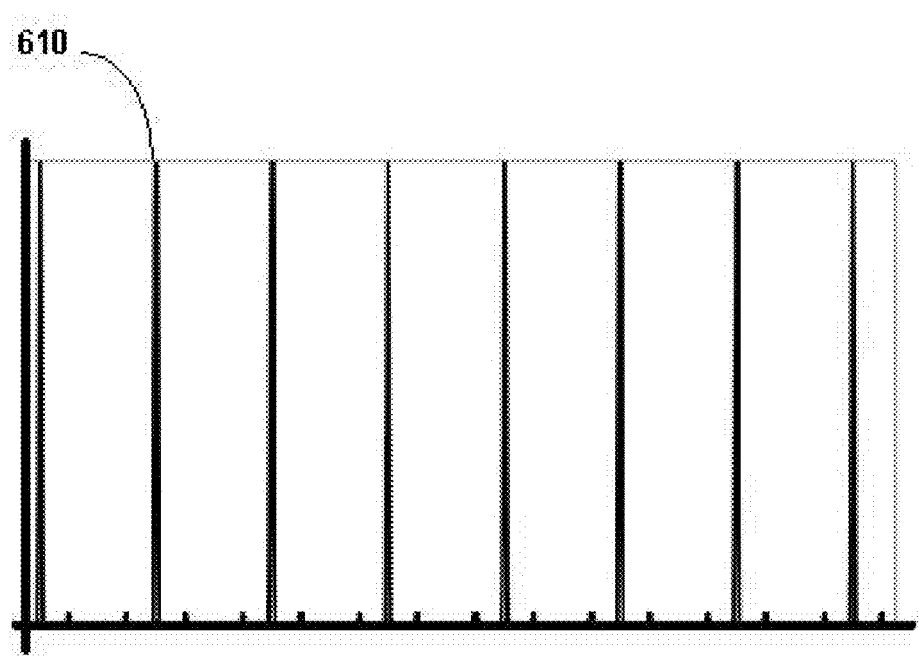

FIG. 6A-FIG. 6B illustrate a more concrete example. In this example, a 0.4 nm mode spacing was wanted but at 600 μm the $L_{cavity}$ in the original design was too short to achieve sufficient optical power. So, $L_{ext}$ was set at the original $L_{cavity}$ (i.e., 600 μm), and N was selected as 4 such that $L_{cavity}'$ was now 2.4 mm. FIG. 6A shows the transmissions 600, 605 of the lasing cavity 110 and the external cavity 115, respectively, while FIG. 6B shows the transmission signal 615 of the coupled cavity.

Figure 7A:
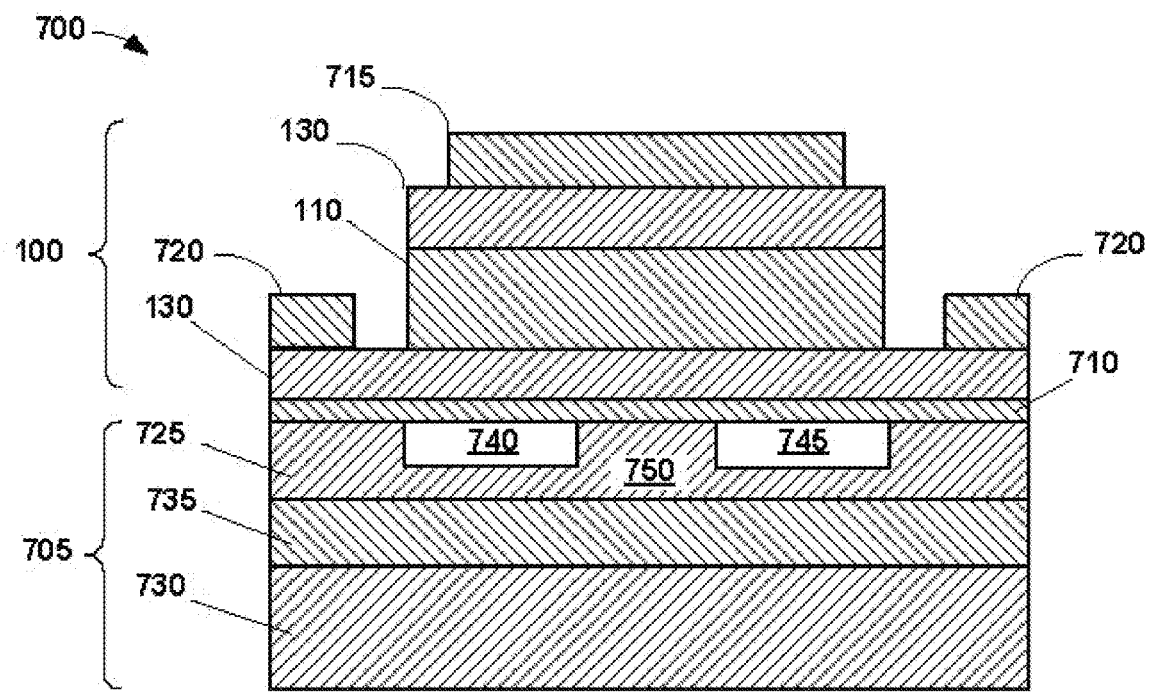
FIG. 7A-FIG. 7B illustrate the quantum dot comb laser of FIG. 1 bonded to a semiconducting chip.
Figure 7B:
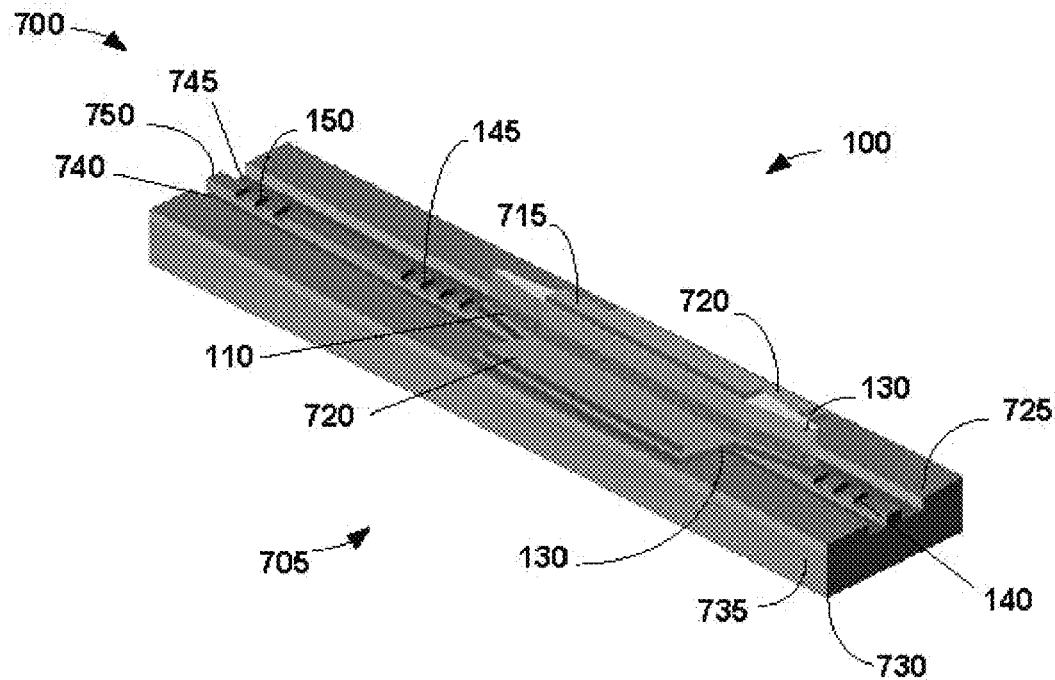

In one example a quantum dot comb laser is fabricated as a part of a quantum dot-based hybrid silicon comb laser using wafer bonding with on-chip mirrors and grating couplers. One such quantum dot-based hybrid silicon comb laser 700 is shown in FIG. 7A-FIG. 7B, wherein the quantum dot material stack 100 of FIG. 1 is bonded to a semiconducting chip 705. FIG. 7A is a cross-section and includes a section of the quantum dot comb laser 100 of FIG. 1 along line 7-7 therein. FIG. 7B is a perspective view of the example in FIG. 7A.

FIG. 7A-FIG. 7B illustrate a quantum dot-based hybrid silicon comb laser 700, which is an assembly of a quantum dot comb laser 100, shown in FIG. 1, wafer bonded to a semiconducting chip 705 using a layer of a bonding material 710. (The bonding material 710 is not visible in FIG. 7B as it is obscured by the cladding 130 on the chip side of the quantum dot comb laser 100.) FIG. 7A and FIG. 7B show the cladding 130 and the lasing cavity 110 of the quantum dot comb laser 100 as shown schematically in FIG. 1. Also shown are the P-contact 715 and the N-contacts 720 through which electrical power is delivered to the lasing cavity 110. Note that the P-contact 715 and the N-contacts are omitted in FIG. 1. The semiconducting chip 705 includes first and second silicon ("SI") layers 725, 730 separated by an insulated buried oxide ("BOX") layer 735. The first silicon layer 725 defines two air channels 740, 745 that, in turn, define a silicon rib waveguide 750.

Figure 8:
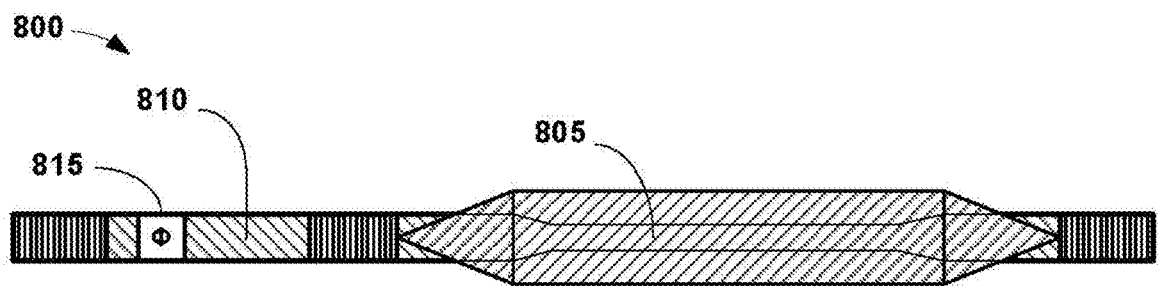
FIG. 8 illustrates a quantum dot comb laser with a phase tuner in the external cavity.
Figure 9:
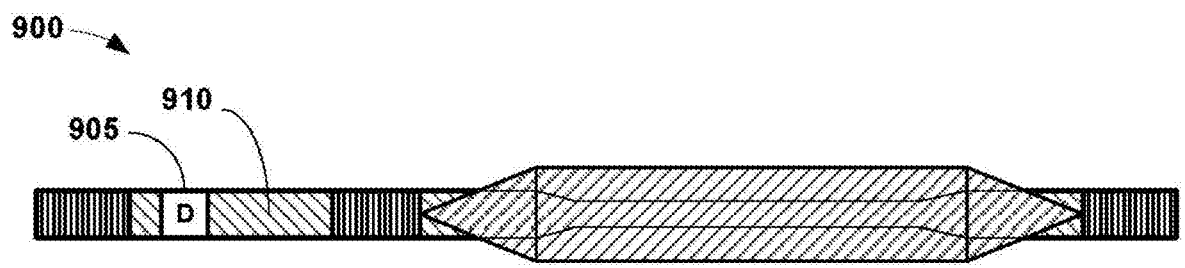
FIG. 9 illustrates a quantum dot comb laser with, a dispersion management section in the external cavity.
Figure 10:
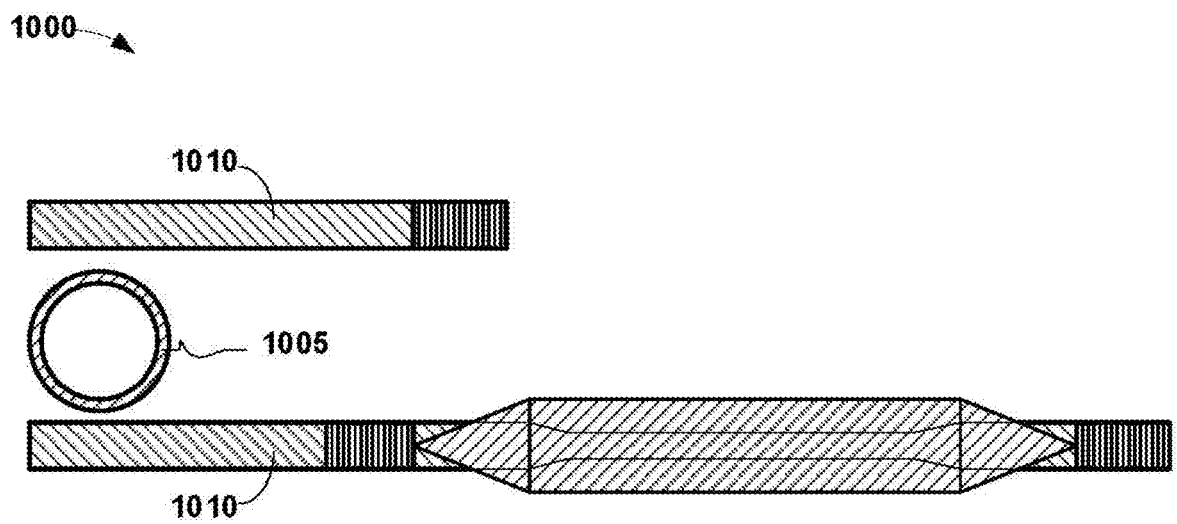
FIG. 10 illustrates a quantum dot comb laser including a ring resonator in the external cavity.
Figure 11:
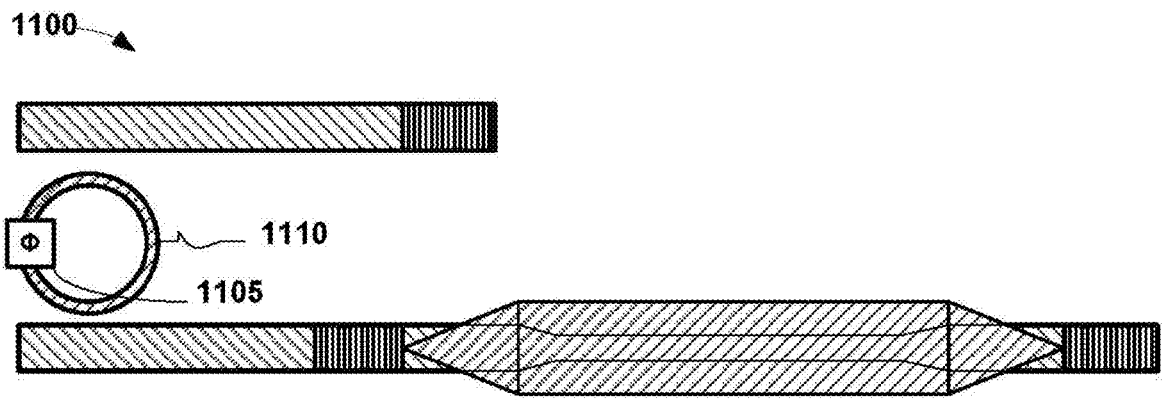
FIG. 11 illustrates a quantum dot comb laser including a ring resonator in the external cavity and a phase tuner in the ring resonator.
Figure 12:
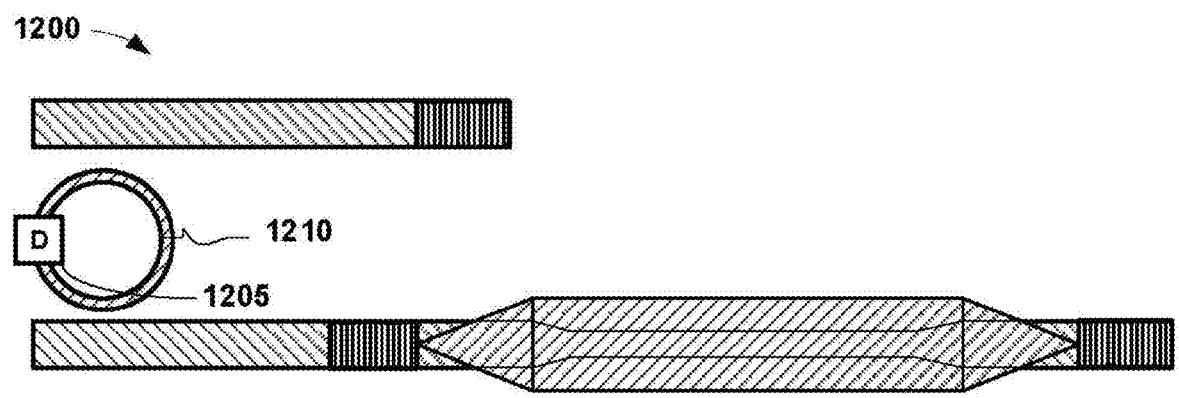
FIG. 12 illustrates a quantum dot comb laser including a ring resonator in the external cavity and a dispersion management section in the ring resonator.

Some examples may include techniques used for tuning or conditioning the transmissions. FIG. 8 depicts a quantum dot comb laser 800 including a lasing cavity 805 and an external cavity 810 as described above, and further includes a phase tuner 815 in the external cavity 810. The phase tuner 815 may be used to align the transmission peak of the laser cavity with those of the external cavity. Phase tuners can be realized by resistive heating, carrier injection, or metal oxide semiconductor ("MOS") tuning. FIG. 9 depicts a quantum dot comb laser 900 that includes a dispersion management section 905 in the external cavity 910. The dispersion management section can be realized using slot waveguides, photonic crystal waveguides, or chirped Bragg gratings. FIG. 10 depicts a quantum dot comb laser 1000 including a ring resonator 1005 in the external cavity 1010. FIG. 11 and FIG. 12 illustrate quantum dot comb lasers 1100, 1200, respectively, that include a phase tuner 1105 and a dispersion management section 1205, respectively, in their respective ring resonators 1110, 1210.

Figure 13:
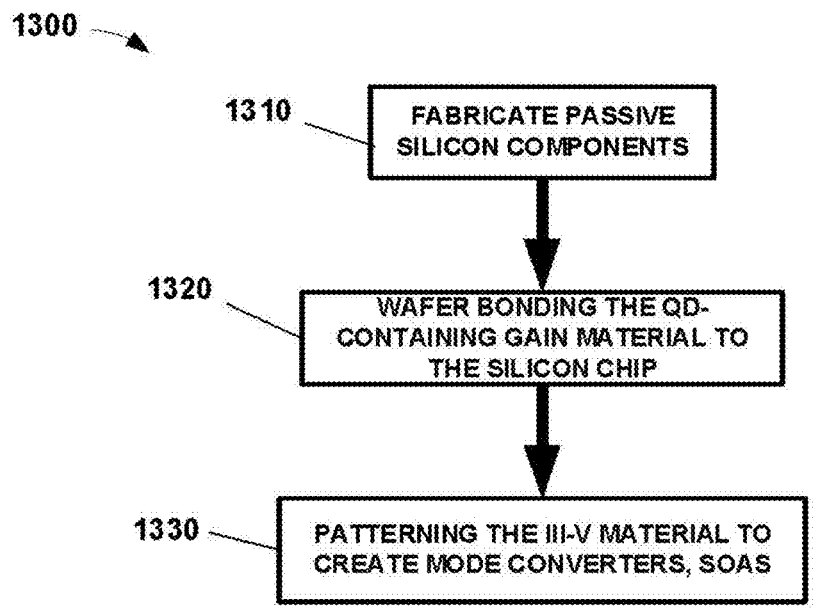
FIG. 13 illustrates a method for fabricating a quantum dot comb laser such as the one depicted in FIG. 7A-FIG. 7B.
Figure 14:
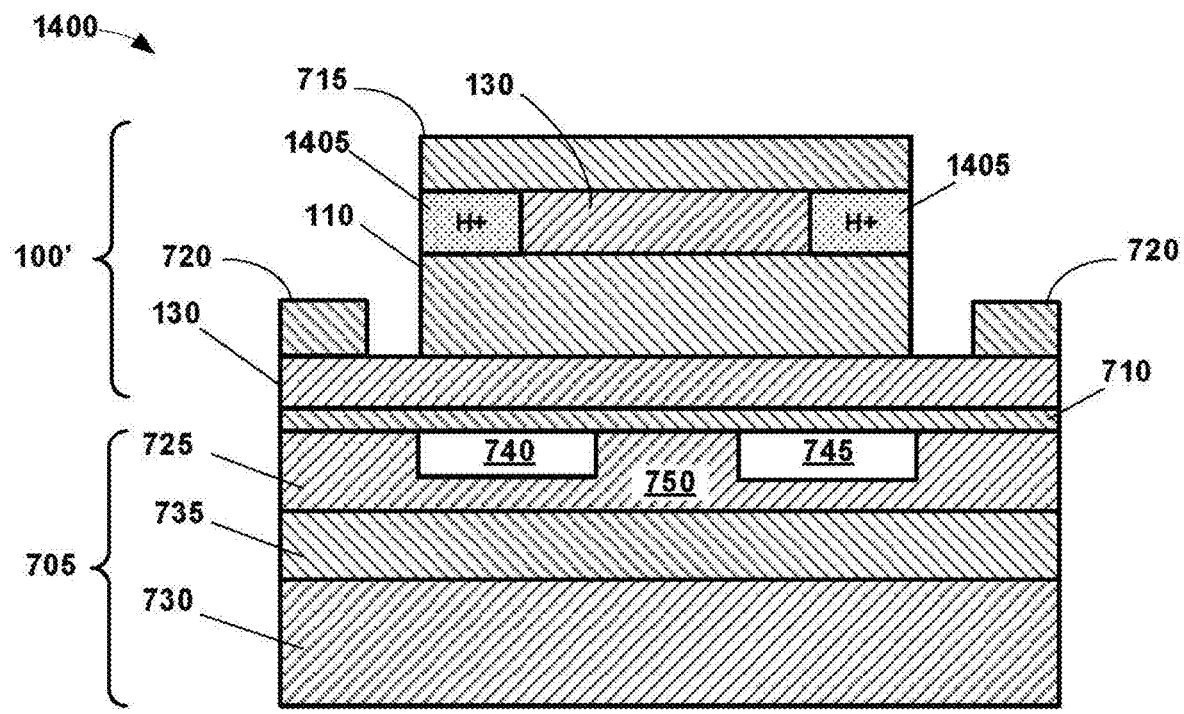
FIG. 14 illustrates is a cross-section of a quantum dot laser that uses proton implantation to define a current channel within a waveguide.

Turning now to FIG. 13, a method 1300 by which a quantum dot comb laser such as the quantum dot comb laser 700 in FIG. 7A-FIG. 6B may be fabricated. The method 1300 includes fabricating (at 1310) passive silicon components (e.g., the Si waveguide, mirrors, gratings, etc.). The method 1300 also includes (at 1320) wafer bonding the quantum dot ("QD")-containing gain material to the silicon chip. The method 1300 also includes patterning the III-V material (at 1330) to create mode converters, SOAs and saturable absorbers (not shown, and where used).

Figure 15:
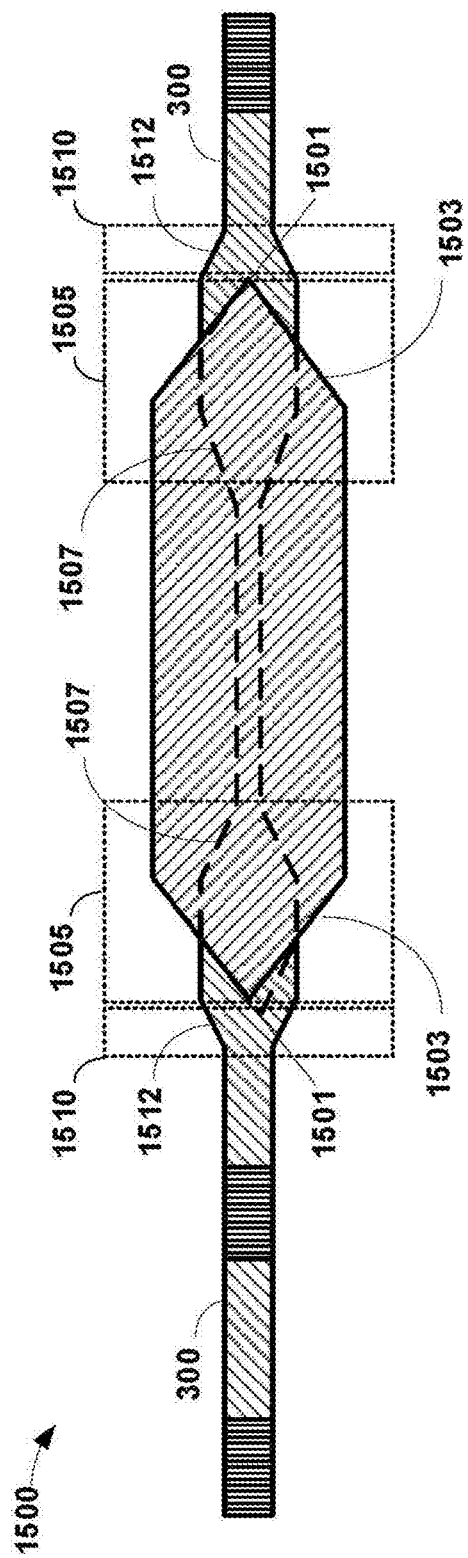
FIG. 15 illustrates a quantum dot comb laser that uses two mode converters.

Those skilled in the art having the benefit of this disclosure will be able to appreciate further variations with the scope of that which is claimed below. For example, FIG. 15 illustrates a quantum dot comb laser 1500 that is a variation on the quantum dot comb laser 700 of FIG. 7A-FIG. 7C. In the quantum dot comb laser 700, the current is confined to the waveguide 750 by the etched channels 740. The quantum dot comb laser 1500 includes two sections 1505 of proton implantation. Such proton implantation produces a high electrical resistance. The electrical current will prefer the path of least electrical resistance, which will be the center of the waveguide (i.e., the lasing cavity 110). The electrical carriers (not shown) will have a larger overlap with the optical mode which could generally yield a higher gain if not offset by optical loss resulting from concomitant increase in overlap of the mode with the sidewall.

For another example, the quantum dot comb lasers 100, 300 of FIG. 1 and FIG. 3A-FIG. 3C define multimode waveguides. More particularly, the tips 1301 of the tapers 1303 in the III-V material lasing cavity 110 are disposed over points in the Si layer 300 that are multimode waveguides. Multimode waveguides include properties that may be undesirable or problematical in some contexts. Accordingly, some examples, such as the example quantum dot laser 1500 in FIG. 16. Recall that mode conversions are typically associated with changes in the width of the waveguide. The quantum dot laser 1500 includes two Si to III-V mode converters 1505 associated with the width changes 1607 and two single mode to multimode converters 1510 associated with the width changes 1512.

Still other variations may become apparent to those skilled in the art. Still other examples may use "saturable absorbers" in the lasing cavity 110, for instance. These and, other such variations are to be considered within the scope of that which is claimed below.

This concludes the detailed description. The particular examples disclosed above are illustrative only, as examples described herein may be modified and practiced in different but equivalent manners apparent to those skilled in the art having the benefit of the teachings herein. Furthermore, no limitations are intended to the details of construction or design herein shown, other than as described in the claims below. It is therefore evident that the particular examples disclosed above may be altered or modified and all such variations are considered within the scope and spirit of the appended claims. Accordingly, the protection sought herein is as set forth in the claims below.

What is claimed is:

1. A quantum dot comb laser comprising:
   a body defining a lasing cavity; and
   an extension wafer-bonded to the body and defining an external cavity, the free spectral range (FSR) of the external cavity being an integer multiple of the lasing cavity FSR; and
   at least one mode converter between the lasing cavity and the external cavity;
   the quantum dot comb laser emitting, in operation, a comb laser signal comprising light at a plurality of wavelengths with a spacing defined by the FSR of the external cavity.

2. The quantum dot comb laser of claim 1, further comprising a phase tuner disposed in the external cavity.

3. The quantum dot comb laser of claim 1, wherein the external cavity includes a ring resonator.

4. The quantum dot comb laser of claim 3, further comprising a phase tuner disposed in the ring resonator.

5. The quantum dot comb laser of claim 3, further comprising a dispersion management section disposed within the ring resonator.

6. The quantum dot comb laser of claim 1, wherein the body further comprises:
   a semiconductor optical amplifier defining the lasing cavity bounded on a first end thereof by a fully reflective mirror and on a second end thereof by an internal partially reflective mirror; and
   an extension from the semiconductor optical amplifier defining the external cavity bounded on a first end thereof by the internal partially reflective mirror and on a second end thereof by an external partially reflective mirror.

7. The quantum dot comb laser of claim 6, wherein the external partially reflective mirror is a grating coupler, a multimode interferometer with a loop mirror, or a directional coupler with a loop mirror.

8. A quantum dot comb laser comprising:
   a semiconductor optical amplifier defining a lasing cavity having a first free spectral range (FSR), the lasing cavity bounded on a first end thereof by a fuller reflective mirror and on a second end thereof by an internal partially reflective mirror; and
   an extension from the semiconductor optical amplifier defining an external cavity having a second FSR, the second FSR being an integer multiple of the first FSR, the external cavity being bounded on a first end thereof by the internal partially reflective mirror and on a second end thereof by an external partially reflective mirror; and
   at least one mode converter between the lasing cavity and the external cavity;
   the quantum dot comb laser emitting, in operation, a comb laser signal comprising light at a plurality of wavelengths with a spacing defined by the second FSR.

9. The quantum dot comb laser of claim 8, wherein the external partially reflective mirror is a grating coupler, a multimode interferometer with a loop mirror, or a directional coupler with a loop mirror.

10. The quantum dot comb laser of claim 8, further comprising a ring resonator disposed within the external cavity.

11. The quantum dot comb laser of claim 8, further comprising a phase tuner or a dispersion management section disposed within the external cavity.

12. The quantum dot comb laser of claim 8, further comprising:
    a ring resonator included in the external cavity; and
    a dispersion management section disposed within the ring resonator.

13. A quantum dot comb laser, comprising:
    a semiconductor optical amplifier defining a lasing cavity having a first free spectral range (FSR), the lasing cavity bounded on a first end thereof by a fully reflective mirror and on a second end thereof by an internal partially reflective mirror;
    an extension from the semiconductor optical amplifier defining an external cavity having a second FSR, the second FSR being an integer multiple of the first FSR, the external cavity being bounded on a first end thereof by the internal partially reflective mirror and on a second end thereof by an external partially reflective mirror; and
    at least one mode converter between the lasing cavity and the external cavity;
    the quantum dot comb laser emitting, in operation, a comb laser signal comprising light at a plurality of wavelengths with a spacing defined by the second FSR.

14. The quantum dot comb laser of claim 13, wherein the external partially reflective mirror is a grating coupler, a multimode interferometer with a loop mirror, or a directional coupler with a loop mirror.

15. The quantum dot comb laser of claim 13, further comprising a phase tuner disposed within the external cavity.

16. The quantum dot comb laser of claim 13, further comprising a ring resonator disposed within the external cavity.

17. The quantum dot comb laser of claim 13, further comprising a dispersion management section disposed within the external cavity.

18. The quantum dot comb laser of claim 1, wherein:
    the body is fabricated from a direct bandgap material; and
    the extension is fabricated from an indirect bandgap material.

19. The quantum dot comb laser of claim 8, wherein:
    the body is fabricated from a direct bandgap material; and
    the extension is fabricated from an indirect bandgap material.

20. The quantum dot comb laser of claim 13, wherein:
the semiconductor optical amplifier is fabricated from a direct bandgap material; and
the extension is fabricated from an indirect bandgap material.

\* \* \* \* \*